United States Patent
Bushard et al.

(10) Patent No.: US 7,318,182 B2
(45) Date of Patent: Jan. 8, 2008

(54) MEMORY ARRAY MANUFACTURING DEFECT DETECTION SYSTEM AND METHOD

(75) Inventors: Louis Bernard Bushard, Rochester, MN (US); Sang Hoo Dhong, Austin, TX (US); Brian King Flachs, Georgetown, TX (US); Osamu Takahashi, Round Rock, TX (US); Michael Brian White, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 11/002,692

(22) Filed: Dec. 2, 2004

(65) Prior Publication Data

US 2006/0156090 A1 Jul. 13, 2006

(51) Int. Cl.
*G01R 31/28* (2006.01)

(52) U.S. Cl. .................. 714/733; 714/718; 714/30; 714/719; 714/734; 714/736; 365/201

(58) Field of Classification Search .................... None
See application file for complete search history.

(56) References Cited

U.S. PATENT DOCUMENTS 5,173,906 A * 12/1992 Dreibelbis et al. .......... 714/733
6,543,019 B2 * 4/2003 Kniffler et al. ............. 714/733
6,560,740 B1 * 5/2003 Zuraski et al. ............. 714/733

* cited by examiner

*Primary Examiner*—Guy Lamarre
*Assistant Examiner*—John P Trimmings
(74) *Attorney, Agent, or Firm*—Carr LLP; D'Ann N. Rifai

(57) ABSTRACT

The present invention provides for a method for memory array verification. Initialization commands are received and memory array initialization settings are generated based on received initialization commands. The memory array initialization settings are stored in a memory array. A deterministic read output function for the memory array is identified and a logic built-in self test scan on the memory array is performed based on the identified deterministic read output function.

11 Claims, 2 Drawing Sheets

MEMORY ARRAY MANUFACTURING DEFECT DETECTION SYSTEM AND METHOD

TECHNICAL FIELD

The present invention relates generally to the field of circuit design and testing and, more particularly, to a system and method for memory array manufacturing defect detection.

BACKGROUND

Modern electronic devices often include built-in self-testing (BIST) logic to support a variety of tests on the device circuitry. For example, many modern processors contain memory arrays commonly employed to buffer data between one or more system components. As memory array technology continues to improve, the speed and accuracy of testing these memory elements has become increasingly important. Many typical memory BIST systems and/or methods test single memory arrays through a separate test circuit, generally located on a distant part of the chip relative to where the memory array is located, that provides data and address control during self-test operations.

In particular, many systems employ array built-in self-testing (ABIST) logic to perform certain tests on memory arrays within the system. However, typical test configuration designs can increase problems associated with signal routing within the system, and can increase the design complexity of the circuits to be tested. Additionally, many self-test configurations require additional test circuits, which can also increase design time and complexity. Moreover, in systems that also employ logic built-in self-testing (LBIST) functionality, the interface between the LBIST domain and the ABIST domain can become significantly complicated and/or convoluted, thereby requiring even more additional circuitry to stabilize the boundary between the two test domains.

Therefore, there is a need for a system and/or method for memory array manufacturing defect detection that addresses at least some of the problems and disadvantages associated with conventional systems and methods.

SUMMARY

The present invention provides for a method for memory array verification. Initialization commands are received and memory array initialization settings are generated based on received initialization commands. The memory array initialization settings are stored in a memory array. A deterministic read output function for the memory array is identified and a logic built-in self test scan on the memory array is performed based on the identified deterministic read output function.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
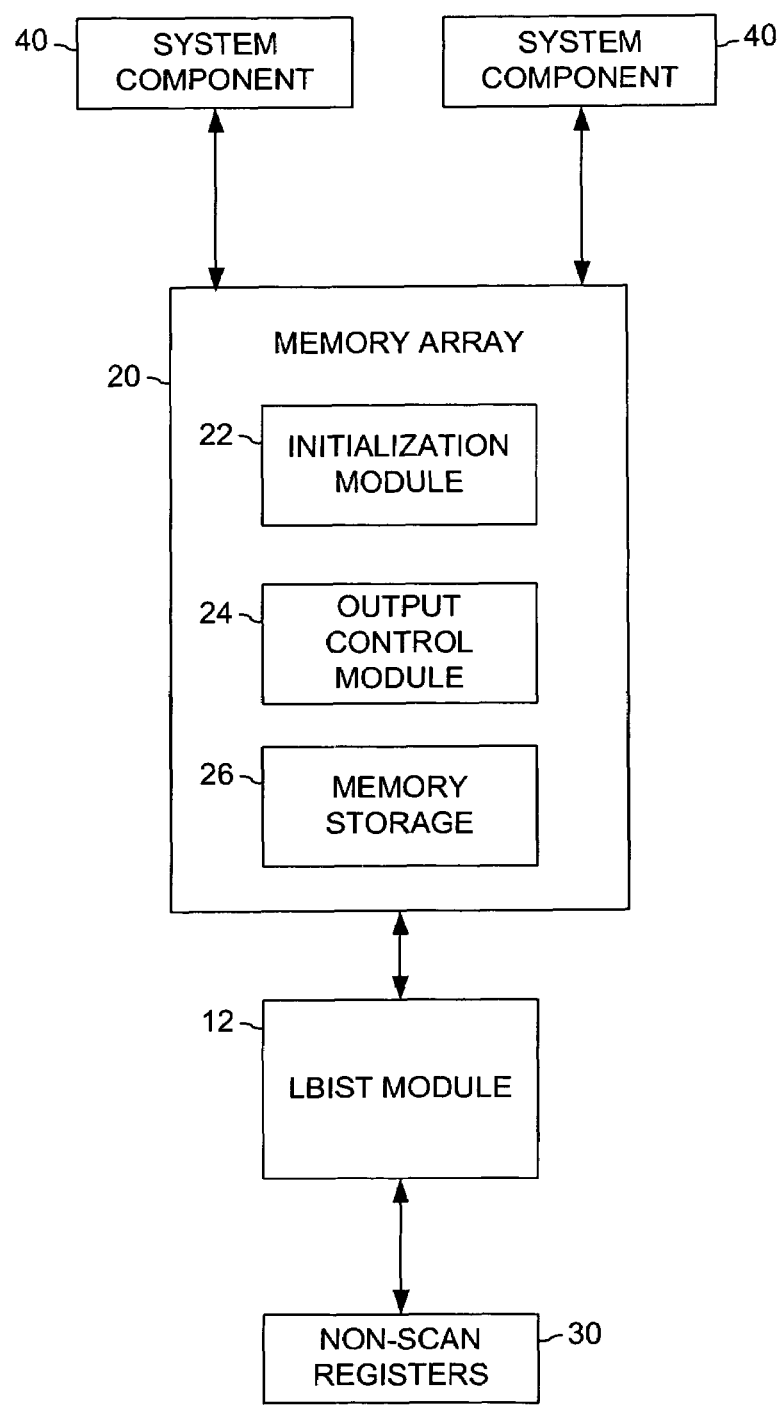
FIG. 1 is a block diagram depicting a memory array verification system.

Referring to FIG. 1 of the drawings, the reference numeral 10 generally designates a computer system. Computer system 10 includes LBIST module 12. LBIST module 12 is a circuit or circuits or other suitable logic and is configured to perform LBIST operations. In one embodiment, LBSIT module 12 is further configured to generate and transmit initialization commands to memory array 20 and/or one or more non-scan registers 30, as described in more detail below. Generally, as will be understood by one skilled in the art, LBIST operations include generating a data pattern and applying the data pattern to a circuit or other logic under test to determine whether the circuit is functional or otherwise meets the intended design specifications.

Typically, LBIST operations are performed on functional logic as opposed to memory or data storage logic. Generally, LBIST data patterns can be random or pseudo-random patterns and the test result is a pass/fail result. That is, an LBIST operation can determine whether the logic under test produces the correct or otherwise desired output based on the data pattern input. For example, in one LBIST implementation, a multi-input shift register (MISR) can be employed to generate an output signature that can provide a pass/fail result. It will be understood to one skilled in the art that while modern LBIST compression algorithms are not presently configured to unroll the output signature to identify a failure point, future designs can be configured without that restriction. Additionally, observing the output signature in a more linear fashion can be employed to identify the failing cycle, which can then be correlated to the failing pattern. It will be understood to one skilled in the art that other configurations can also be employed.

In contrast, typical ABIST operations are preformed on memory or data storage logic and are designed to identify how one storage bit affects another storage bit. Thus, typical ABIST operations include certain back-to-back operations that are not ordinarily employed during LBIST operations, such as, for example, a read/write/read combination, a read/read/write combination, or other suitable operations. Accordingly, ABIST circuitry can be significantly more complex than LBIST circuitry and can identify where within an array a fault occurs. As described in more detail below, computer system 10 can be configured to achieve some of the desirable testing functionality of ABIST memory array testing operations through LBIST operations applied to memory arrays. Thus, memory arrays can be configured to operate within an LBIST testing domain, which can simplify overall circuit design and testing.

In particular, in the illustrated embodiment, LBIST module 12 is coupled to one or more non-scan registers 30. Non-scan registers 30 are circuits or other suitable logic, and are configured to operate as registers and/or latches, as will be understood to one skilled in the art. In one mode of operation, for example, LBIST module 12 is configured to perform standard LBIST operations to test one or more non-scan registers 30.

LBIST module 12 is also coupled to memory array 20. Array 20 is a circuit or circuits or other suitable logic, and is configured as a memory array, or otherwise configured to store data, as will be understood to one skilled in the art. As described in more detail below, array 20 is further configured to operate in response to standard LBIST operations in conjunction with LBIST module 12. In the illustrated embodiment, array 20 is coupled to one or more system components 40. In one mode of operation, array 20 is configured to receive data from one or more system components 40, to store received data, and to transmit or otherwise provide or make available received and/or stored data to one, or more system components 40, as will be understood to one skilled the art.

Memory array 20 includes initialization module 22, output control module 24, and memory storage 26. Memory storage 26 is a circuit or circuits or other suitable logic or device and is configured to store and retrieve or otherwise provide stored data, as will be understood to one skilled in the art. In one embodiment, memory storage 26 includes a plurality of word lines and a plurality of bit lines, as will be understood to one skilled in the art. Accordingly, memory storage 26 can be comprised of one or more memory cells of static random access memory (SRAM), dynamic RAM (DRAM), synchronous DRAM (SDRAM), or other suitable storage device. It will be understood to one skilled in the art that other suitable memory storage devices can also be employed.

Initialization module 22 is a circuit or circuits or other suitable logic and is configured to receive initialization commands from LBIST module 12, to generate initial state settings for memory storage 26 based on received initialization commands, and to write or otherwise apply initial state settings to memory storage 26. In one embodiment, initialization commands include initial state and/or data settings. Generally, initial state and/or data settings are one or more known inputs, as will be understood to one skilled in the art. In an alternate embodiment, as described in more detail below, initialization commands also specify a deterministic read output function. Generally, a deterministic read output function is a function that always returns the same output or outputs for a given set of inputs, as will be understood to one skilled in the art. Additionally, in one embodiment, initialization module 22 is configured to write each word line of memory storage 26 simultaneously. As used herein, "each" means all of a particular subset.

Memory array 20 also includes output control module 24. Output control module 24 is a circuit or circuits or other suitable logic and is configured to identify or otherwise read the memory state of memory storage 26, to generate a deterministic output based on the memory state of memory storage 26, and to transmit or otherwise provide the generated deterministic output to LBIST module 12. Generally, the memory state of memory storage 26 is the particular logic state of the bits of memory storage 26, which represent the data stored therein, as will be understood to one skilled in the art. In particular, in one embodiment, output control module 24 is configured to generate a deterministic output based on the memory state of memory storage 26 and the deterministic read output function.

In one embodiment, output control module 24 is configured to generate a deterministic output based on a predetermined deterministic read output function. In an alternate embodiment, output control module 24 is configured to receive initialization commands from LBIST module 12, and to employ a deterministic read output function based on received initialization commands. It will be understood to one skilled in the art that other configurations can also be employed.

Thus, initialization module 22 and output control module 24 together are configured to make array 20 appear as a non-scanable register to LBIST module 12 within the otherwise normal chip logic flow, which serves to move the array 20 into the LBIST testing domain. Generally, array 20 appears as a non-scanable register when the following conditions are met. First, the circuit under test, that is, array 20, must not hold a particular static state value and must have a deterministic read output function. This condition is met through the operation of output control module 24, as described above.

Second, all the array registers must have an initial value. This condition is met through the operation of initialization module 22. Finally, to avoid state feedback, the array registers must update in a fashion similar to the other non-scanable registers. This condition is met through the operation of output control module 24. Thus, when the above conditions are met, array 20 can be tested with the same testing circuitry and patterns typically already required to test the logic circuitry, that is, the standard LBIST testing circuitry.

Accordingly, memory array 20 can be subjected to initialization wherein the initial testing data is set on the array, that is, memory array 20 is programmed with a set and known data field or data vector. Furthermore, memory array 20 can be configured with a deterministic output function, that is, with a certain input data configuration, memory array 20 will yield a certain output under LBIST testing. Thus, memory array 20 can be configured to appear as a non-scanable register to LBIST module 12.

Therefore, system 10 can be configured to test one or more specially configured memory arrays of varying sizes in parallel with other logic in computer system 10, such as, for example, non-scan registers 30, while requiring very little additional testing or other circuitry, if any. Thus, additional design circuitry, complexity, and design time can be reduced, which can increase both chip manufacturing productivity and test engineer efficiency. Moreover, by testing the memory arrays through LBIST operations, individual ABIST operations for each system memory array can be minimized, which can reduce a common time consuming testing scenario where there are multiple arrays in the system. Thus, in one embodiment, system 10 can be configured without any ABIST logic, which can accrue benefits in reduced circuit area, timing, and power requirements. It will be understood by one skilled in the art that an objective of employing LBIST operations to verify memory array functionality is to determine only whether the memory array functions properly, rather than to identify specifically where a fault, if any, is located within the array.

For example, generally, certain memory arrays exist that are configured with a word line of a small enough length that the array test can be simplified to a simple pass/fail test. Thus, for these particular arrays, a typical ABIST engine, and associated complicated circuitry, is unnecessary and can be eliminated. Elimination of an unnecessary or otherwise redundant ABIST engine can significantly reduce the complexity of the overall circuit and/or chip, as well as reduce design and testing time. Additionally, reduced circuitry can also result in reduced power consumption and reductions in other associated problems, as will be understood to one skilled in the art. Moreover, the LBIST test parameters can also be, modified or biased, to account for varying word line lengths, as will be understood to one skilled in the art.

Figure 2:
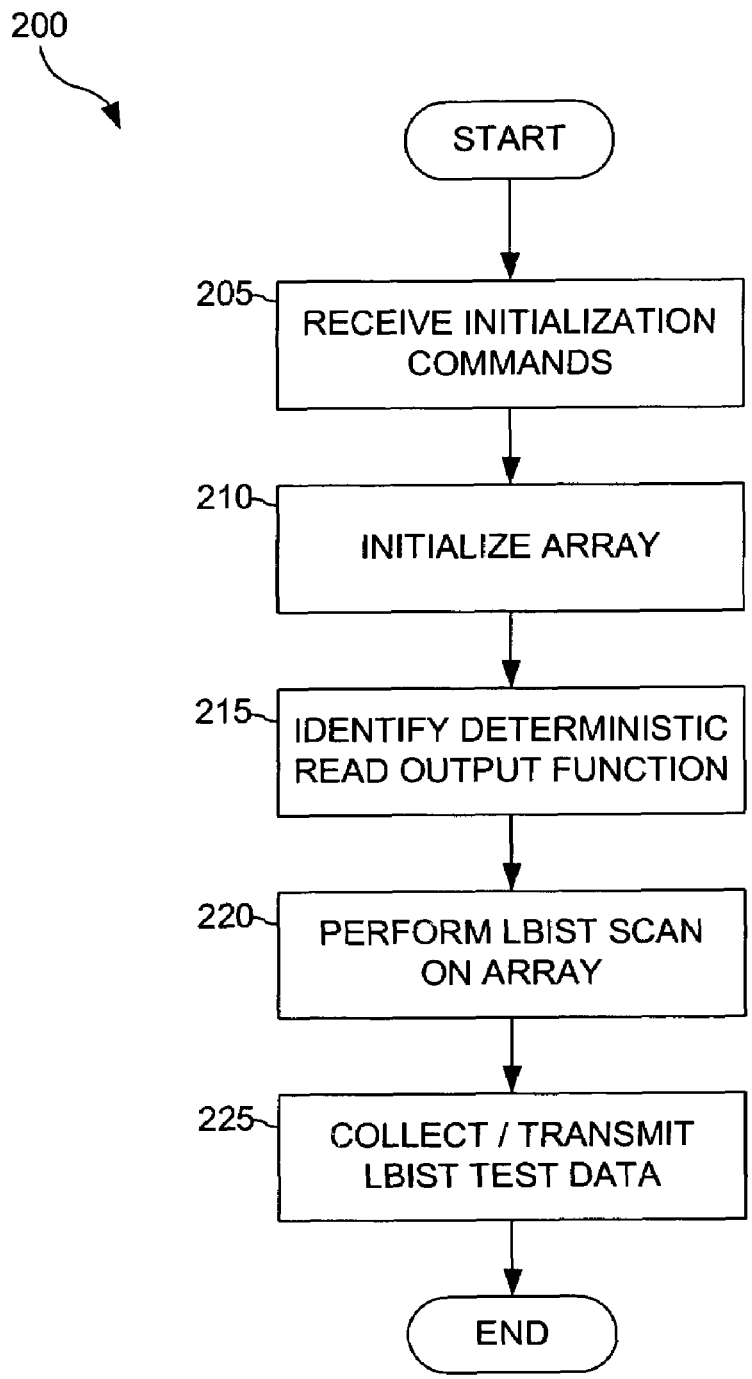
FIG. 2 is a flow diagram depicting a memory array verification method.

Referring now to FIG. 2 of the drawings, the reference numeral 200 generally designates a flow diagram illustrating a method for array verification. The process begins at step 205, initialization commands are received. This step can be performed by, for example, initialization module 22 of FIG. 1, receiving initialization commands from LBIST module 12. At next step 210, the memory array is initialized based on received initialization commands. This step can be performed by, for example, initialization module 22 of FIG. 1. Step 210 can also include setting initial testing data in the memory storage 26 of array 20 of FIG. 1.

At next step 215, a deterministic output function is identified. This step can be performed by, for example, output control module 24 of FIG. 1. In one embodiment, a deterministic output function is predetermined, and is included or preset within output control module 24 of FIG. 1. In an alternate embodiment, a deterministic output function can be generated or otherwise configured each time the logic or memory running under test is tested. As used herein, "each" means all of a particular subset. In an alternate embodiment, a deterministic output function can be identified based on received initialization commands from LBIST module 12. It will be understood to one skilled in the art that other configurations can also be employed.

At next step 220, LBIST operations are performed to scan the memory array or arrays under test. This step can be performed by, for example, LBIST module 12 and output control module 24 of FIG. 1. At next step 225, the data from the LBIST scan is collected by, or otherwise transmitted to, LBIST module 12. This step can be performed by, for example, output control module 24 or LBIST module 12 of FIG. 1. It will be understood to one skilled in the art that several iterations or cycles of the LBIST scan and data collection can also be employed. In the illustrated embodiment, the array under test is subject to one cycle of testing and data collection.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for memory array verification, comprising:
   receiving initialization commands;
   generating memory array initialization settings based on the received initialization commands;
   storing the memory array initialization settings in a memory array;
   identifying a predetermined deterministic read output function for the memory array based on the received initialization commands; and
   performing a logic built-in self test scan on the memory array based on the identified predetermined deterministic read output function.

2. The method as recited in claim 1, wherein the logic built-in self test scan comprises a multi-cycle test.

3. The method as recited in claim 1, further comprising performing a logic built-in self test on at least one non-scan register in parallel with the logic built-in self test scan on the memory array.

4. A processor for memory array verification, the processor including an executable computer program tangibly embodied in a medium accessible by the processor, the executable computer program comprising:
   computer program code for receiving initialization commands;
   computer program code for generating memory array initialization settings based on the received initialization commands;
   computer program code for storing the memory array initialization settings in a memory array;
   computer program code for identifying a predetermined deterministic read output function for the memory array based on the received initialization commands; and
   computer program code for performing a logic built-in self test scan on the memory array based on the identified predetermined deterministic read output function.

5. The processor as recited in claim 4, wherein the logic built-in self test scan comprises a multi-cycle test.

6. The processor as recited in claim 4, further comprising computer program code for performing a logic built-in self test on at least one non-scan register in parallel with the logic built-in self test scan on the memory array.

7. A system for memory array verification, comprising:
   a logic built-in self test module configured to perform logic built-in self test operations and to generate initialization commands;
   a memory array coupled to the logic built-in self test module, comprising at least one word line and configured to store data;
   an initialization module coupled to the logic built-in self test module and the memory array and configured to receive the initialization commands, to generate initialization settings based on the received initialization commands, and to store the initialization settings in the memory array; and
   an output control module coupled to the logic built-in self test module and the memory array and configured to identify a predetermined deterministic read output function based on the received initialization commands, to read data stored in the memory array, and to generate test output based on the read data and the identified predetermined deterministic read output function.

8. The system as recited in claim 7, wherein the initialization module is configured to simultaneously write each word line of the memory array.

9. The system as recited in claim 7, wherein the output control module is further configured to prevent the memory array from maintaining a particular static state value.

10. The system as recited in claim 7, wherein the initialization module is further configured to update the data stored in the memory array based on the logic built-in self test operations.

11. The system as recited in claim 10, wherein the initialization module is further configured to update the data stored in the memory array in the same manner as a non-scan register.

* * * * *